United States Patent
Tran et al.

(10) Patent No.: US 7,136,300 B2
(45) Date of Patent: Nov. 14, 2006

(54) MAGNETIC MEMORY DEVICE INCLUDING GROUPS OF SERIES-CONNECTED MEMORY ELEMENTS

(75) Inventors: Lung The Tran, Saratoga, CA (US); Frederick A. Perner, Palo Alto, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 276 days.

(21) Appl. No.: 10/680,483

(22) Filed: Oct. 6, 2003

(65) Prior Publication Data
US 2005/0073881 A1    Apr. 7, 2005

(51) Int. Cl.
*G11C 11/14* (2006.01)

(52) U.S. Cl. .................. 365/171; 365/173; 365/158

(58) Field of Classification Search ............... 365/171, 365/173, 158
See application file for complete search history.

(56) References Cited

U.S. PATENT DOCUMENTS

| 6,356,477 B1 | 3/2002 | Tran |
| 6,577,529 B1 | 6/2003 | Sharma et al. |
| 6,795,334 B1 * | 9/2004 | Iwata et al. ............ 365/158 |
| 2004/0114425 A1 * | 6/2004 | Ezaki et al. ........... 365/158 |
| 2005/0094458 A1 * | 5/2005 | Eaton et al. ........... 365/222 |

* cited by examiner

*Primary Examiner*—Anh Phung

(57) ABSTRACT

A data storage device includes a cross point array of resistive memory elements and a plurality of blocking elements. The device is arranged in groups. Each group includes series-connected memory elements and a blocking element. The blocking elements are used to prevent sneak path currents from interfering with sense currents during read operations.

26 Claims, 6 Drawing Sheets

MAGNETIC MEMORY DEVICE INCLUDING GROUPS OF SERIES-CONNECTED MEMORY ELEMENTS

BACKGROUND

Magnetic Random Access Memory ("MRAM") is a non-volatile memory that is being considered for short-term and long-term data storage. MRAM has lower power consumption than short-term memory such as DRAM, SRAM and Flash memory. MRAM can perform read and write operations much faster (by orders of magnitude) than conventional long-term storage devices such as hard drives. In addition, MRAM is more compact and consumes less power than hard drives. MRAM is also being considered for embedded applications such as extremely fast processors and network appliances.

Consider an MRAM device including a resistive cross point array of memory cells, word lines extending along rows of the memory cells, and bit lines extending along columns of the memory cells. Each memory cell includes a magnetoresistive element (e.g., a spin dependent tunneling junction) having a resistance state of either $R_{parallel}$ or $R_{anti-parallel}$, depending on its magnetization orientation (parallel or anti-parallel). Each magnetoresistive element lies at a cross point of a word line and a bit line. The magnetoresistive elements in this array are coupled together through many parallel paths. The resistance seen at one cross point equals the resistance of the magnetoresistive element at that cross point in parallel with resistances of magnetoresistive elements in the other rows and columns.

Because of this coupling, parasitic or "sneak path" currents can arise during read operations, while resistance states of selected magnetoresistive elements are being sensed. The parasitic currents can interfere with the sensing of resistance states of the magnetoresistive elements, making for unreliable sensing of the resistance state of a single magnetoresistive element in the resistive cross point array.

Blocking elements such as diodes or transistors can be used to block the sneak path block currents. For example, each magnetoresistive element of an MRAM array is connected in series with a blocking element. These blocking elements improve isolation and signal strength, which can increase the reliability of the sensing.

However, the blocking elements tend to be rather large, as they are formed in or on a semiconductor substrate of the MRAM device. The blocking elements can significantly reduce the density of the memory cells, which in turn can increase the size and cost of the MRAM devices.

There is a need to reliably sense the resistance states of the magnetoresistive memory elements in resistive cross point memory cell arrays, without significantly reducing memory cell density.

SUMMARY

According to one aspect of the present invention, a data storage device includes a cross point array of resistive memory elements and a plurality of blocking elements. The memory elements and the blocking devices are arranged in groups. Each group includes series-connected memory elements and a blocking element.

According to another aspect of the present invention, a method of performing a read operation on a selected memory cell among a group of series-connected magnetoresistive memory cells includes causing a first sense current to flow through the group; sampling the first sense current and storing a first sampled value; writing to the selected memory cell; causing a second sense current to flow through the group; and sampling the second sense current. A second sampled value is compared to the stored value.

Other aspects and advantages of the present invention will become apparent from the following detailed description, taken in conjunction with the accompanying drawings, illustrating by way of example the principles of the present invention.

DETAILED DESCRIPTION

Figure 1:
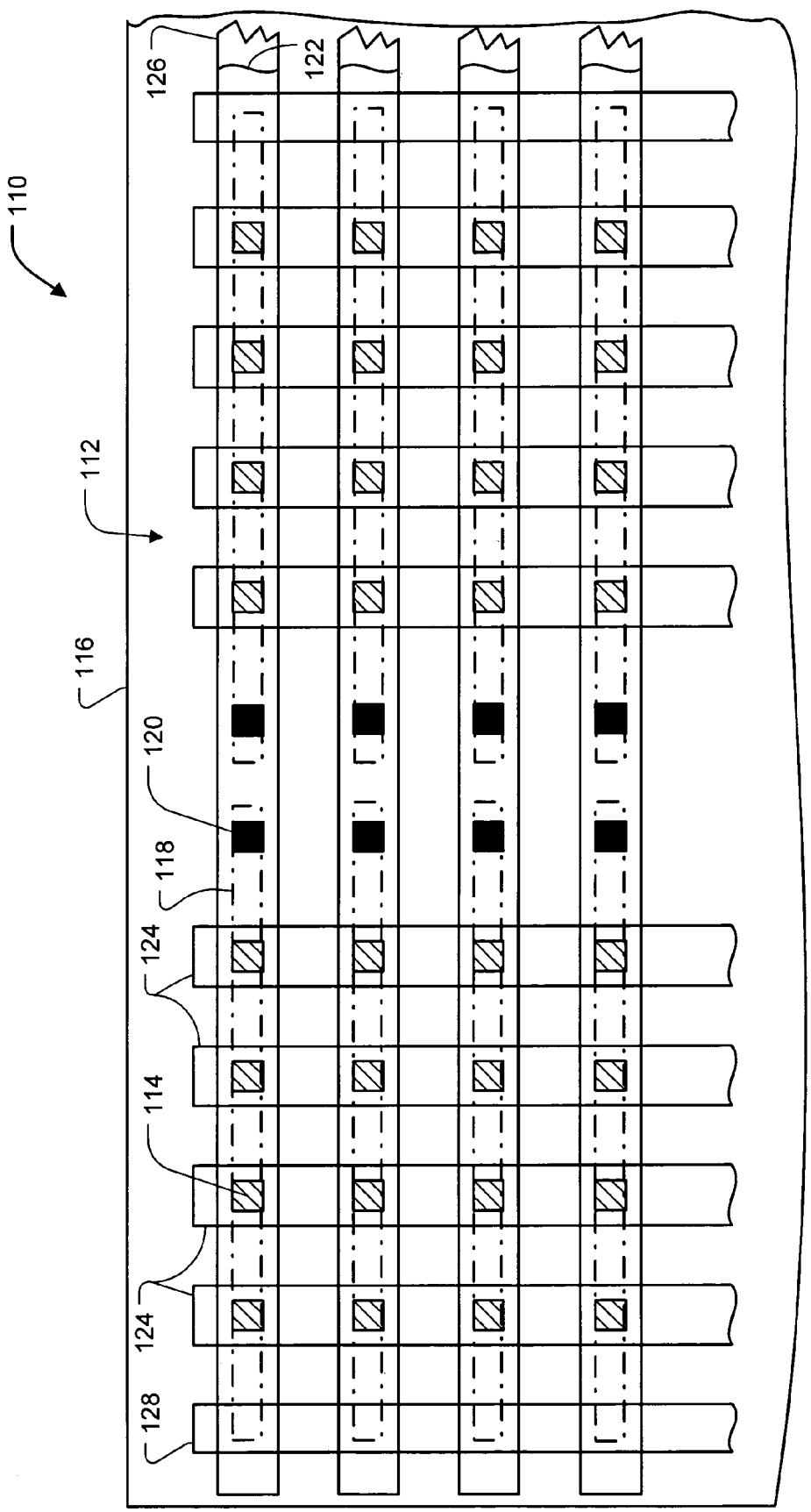
FIG. 1 is an illustration of a data storage device according to an embodiment of the present invention.

Reference is made to FIG. 1. An MRAM device 110 includes a resistive cross point array 112 of magnetic memory elements 114 on a semiconductor substrate 116. The memory elements 114 may include magnetoresistive elements such as tunneling magnetoresistive (TMR) elements. A relatively small number of memory elements 114 are shown. In practice, however, a much larger number of memory elements 114 may be used.

Each memory element 114 has a resistance state of either $R_{parallel}$ or $R_{anti-parallel}$, depending on its magnetization orientation (parallel or anti-parallel). The values of these resistance states will vary across the array 112. That is, different memory elements 114 will have different values for $R_{parallel}$ and $R_{anti-parallel}$.

The device 110 is arranged in groups. Each group includes a plurality of memory elements 114, a conductor referred to as a "read interconnect" line 118, and a sneak path current blocking element 120 such as a diode or transistor. In each group, the memory elements 114 and the blocking element 120 are connected in series by the read interconnect line 118. By way of example, FIG. 1 shows four memory elements 114 per group.

The MRAM device 110 includes read word lines 126 extending along rows of the array 112 and read bit lines 128 extending along columns of the array 112. The read word lines 126 are orthogonal to the read bit lines 128. There is one read word line 126 for each row of memory elements 114 in the array 112, and there is one read bit line 128 for each column of groups. Each group is electrically connected between a read word line 126 and a read bit line 128.

The MRAM device 110 further includes write word lines 122 extending along rows of the array 112 (above the read word lines 126) and write bit lines 124 extending along columns of the array 112. The write word lines 122 are orthogonal to the write bit lines 124. There may be one write word line 122 for each row of the array 112 and one write bit line 124 for each column of the array 112. Each memory element 114 is located at a cross point of a write word line 122 and a write bit line 124.

Figure 2:
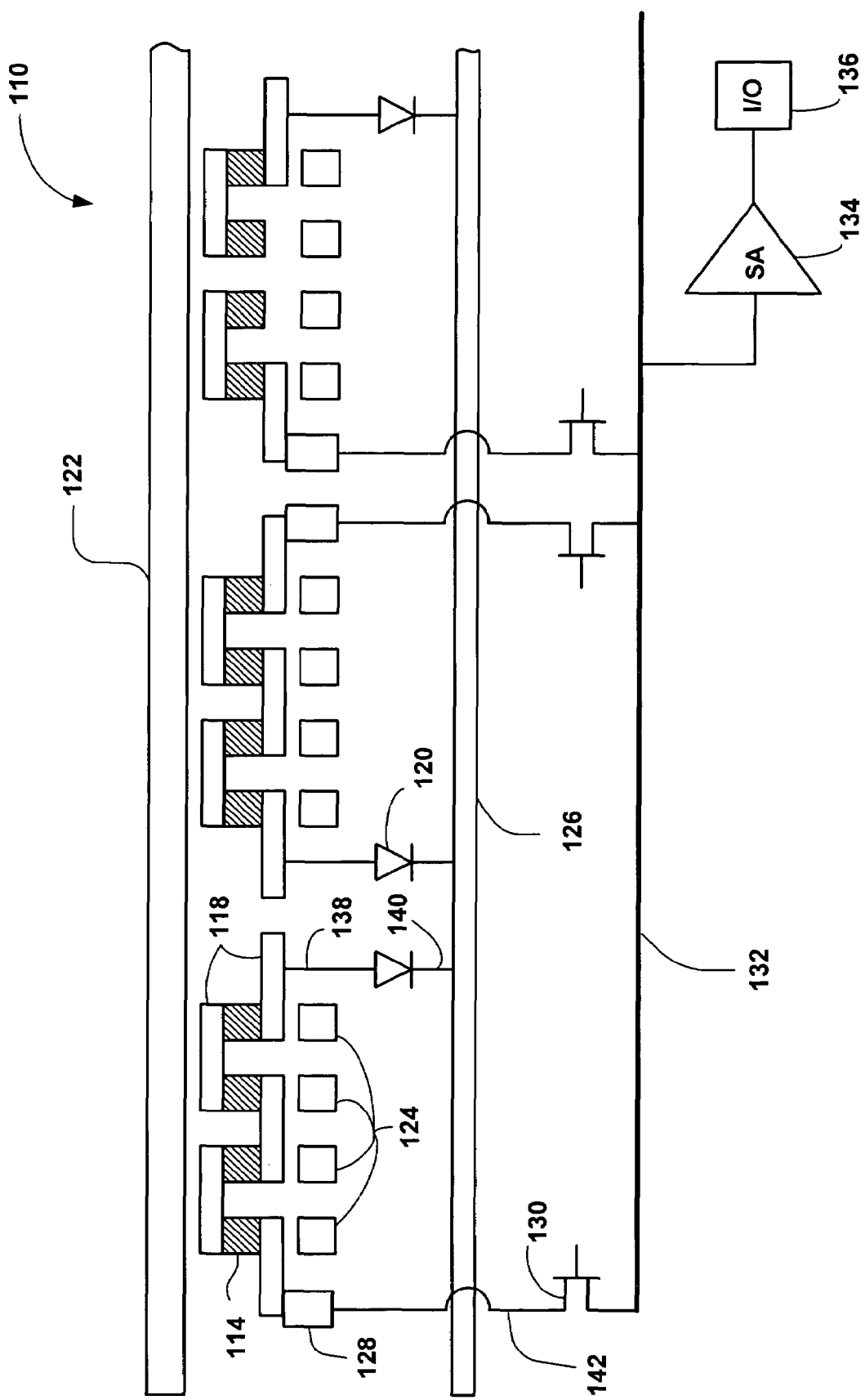
FIG. 2 is an illustration of a row of a data storage device according to an embodiment of the present invention.

Reference is made to FIG. 2, which illustrates a row of the array 112, and which illustrates the blocking devices 120 as diodes 120. The diodes 120 (e.g., thin film diodes) and the read word lines 126 may be formed on the substrate 116, and a read/write circuit may be formed within the substrate 116. The read/write circuit includes decoded bit line select switches 130, a data bus 132, sense amplifiers 134, and I/O registers 136. The read/write circuit includes other elements that are not shown, such as current sources and selection logic for the write lines 122 and 124.

The read bit lines 128 and the write bit lines 124 are formed above the read word lines 126. The orientation—above or below—refers to the order in which these lines 118 and 122–128 are fabricated (e.g., the write bit lines 124 and the read bit lines 128 are formed after the read word lines 126).

The read interconnect lines 118 are formed in discontinuous portions. FIG. 2 shows each read interconnect line 118 having three bottom portions and two top portions that connect four memory elements 114 and a diode 120 in series. The bottom portions of the read interconnect lines 118 are formed above the write bit lines 124 and the read bit lines 128; the memory elements 114 are formed on the bottom portions; and top portions of the read interconnect lines 118 are formed on the memory elements 114. One end of each read interconnect line 118 is connected through a contact to a read bit line 128. The other end of each read interconnect line 118 is connected through a first via 138 to the anode of a diode 120.

The cathode of the diode 120 is connected through a second via 140 to a read word line 126. Each read bit line 128 is coupled to the data bus 132 by a third via 142 and a select switch 130. Vias may be formed by an etch step and then filled with metal followed by a planarization step.

Write word lines 122 are formed above the top portions of the read interconnect lines 118. The write word lines 122 are electrically insulated from the read interconnect lines 118. The write bit lines 124 are electrically insulated from the read interconnect lines 118 and the read lines 126 and 128. Gaps between these lines 118 and 122–128 may be filled with an electrical insulator, such as deposited silicon oxide. Gaps between the memory elements 114 may also be filled with an electrical insulator, such as deposited silicon oxide.

The read interconnect lines 118 may be thinner than the write lines 122 and 124, since the read interconnect lines 118 handle less current during read operations than the write lines 122 and 124 handle during write operations. Moreover, thin read interconnect lines allow the write lines 122 and 124 to be located near the memory elements 114. For good magnetic coupling, the write lines 122 and 124 are located as close as possible to the memory elements 114.

The number of sense amplifiers 134 may have a 1:1 correspondence to the number of groups (i.e., each group is coupled to a single sense amplifier 134). In the alternative, a number of groups may be coupled to a smaller number of sense amplifiers 134. For example, multiple groups are multiplexed into a single sense amplifier 134 (as shown in FIG. 2).

The read/write circuit may actually be a read circuit and a separate write circuit that function independently. For write only operations, only the write circuits may be activated. For self-referencing, multiple sample read operations, the read and write circuits may operate together.

Figure 3:
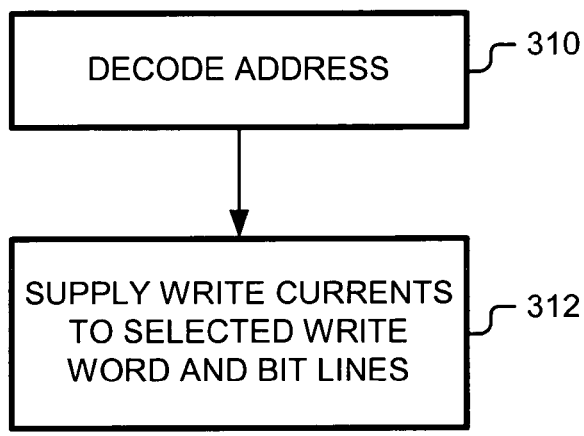
FIG. 3 is an illustration of a method of performing a write operation on a selected memory cell in a data storage device according to an embodiment of the present invention.

Reference is now made to FIG. 3, which illustrates a write operation on a selected memory element 114. At the beginning of a write operation, the read/write circuit receives the address of the selected memory element 114. The read/write circuit decodes the address to select a write word line 122 and a write bit line 124 (step 310), and supplies write currents to the selected write word line 122 and write bit line 124 (step 312). The write currents cause external magnetic fields about the selected write word and bit lines 122 and 124. Together, these magnetic fields orient the magnetization orientation of the selected memory element 114. The direction of the write current in one of the lines 122 or 124 can determine the logic value stored in this selected memory element 114. For instance, write currents of +I on a selected write word line 122 and +I on a selected write bit line 124 might cause a parallel magnetization orientation of the selected memory element 114 (a logic "0"), whereas write currents of +I on a selected write word line 122 and −I on a selected write bit line 124 might cause an anti-parallel magnetization orientation of the selected memory element 114 (a logic "1"). The value stored in the I/O register 136 (that is, the value to be written to the selected memory element 114) determines the direction of the current.

Figure 4:
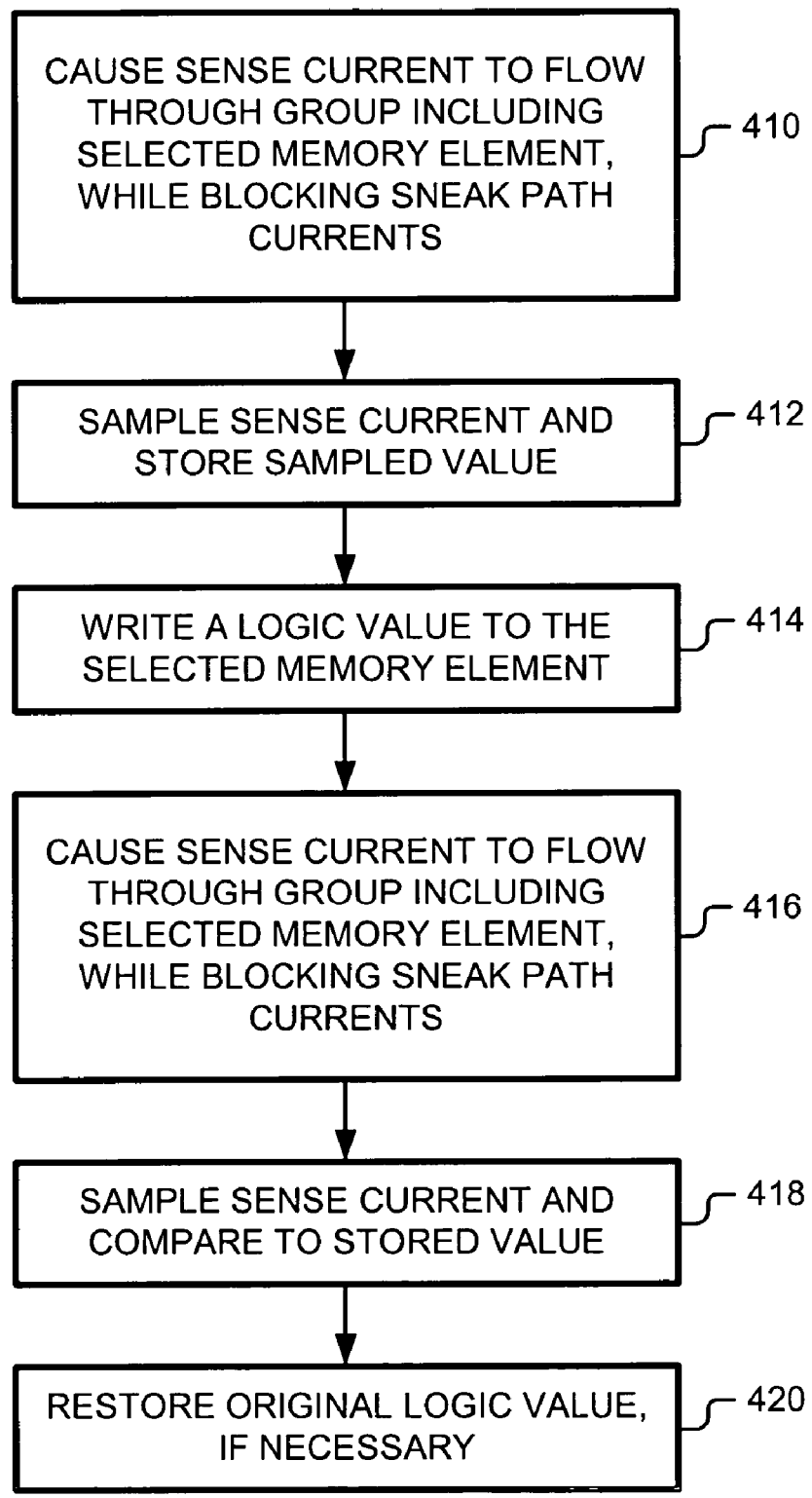
FIG. 4 is an illustration of performing a destructive read operation on a selected memory cell in accordance with an embodiment of the present invention.

Reference is now made to FIG. 4, which illustrates a read operation on a selected memory element 114. The read/write circuit receives the address of the selected memory element 114, and decodes the address to select a read word line 126 and a read bit line 128 so that a sense current flows through the group including the selected memory element 114 (step 410). In addition, sneak path currents are blocked by diodes 120 connected to unselected read word lines 126 so as not to interfere with the sense current (410).

Figure 5:
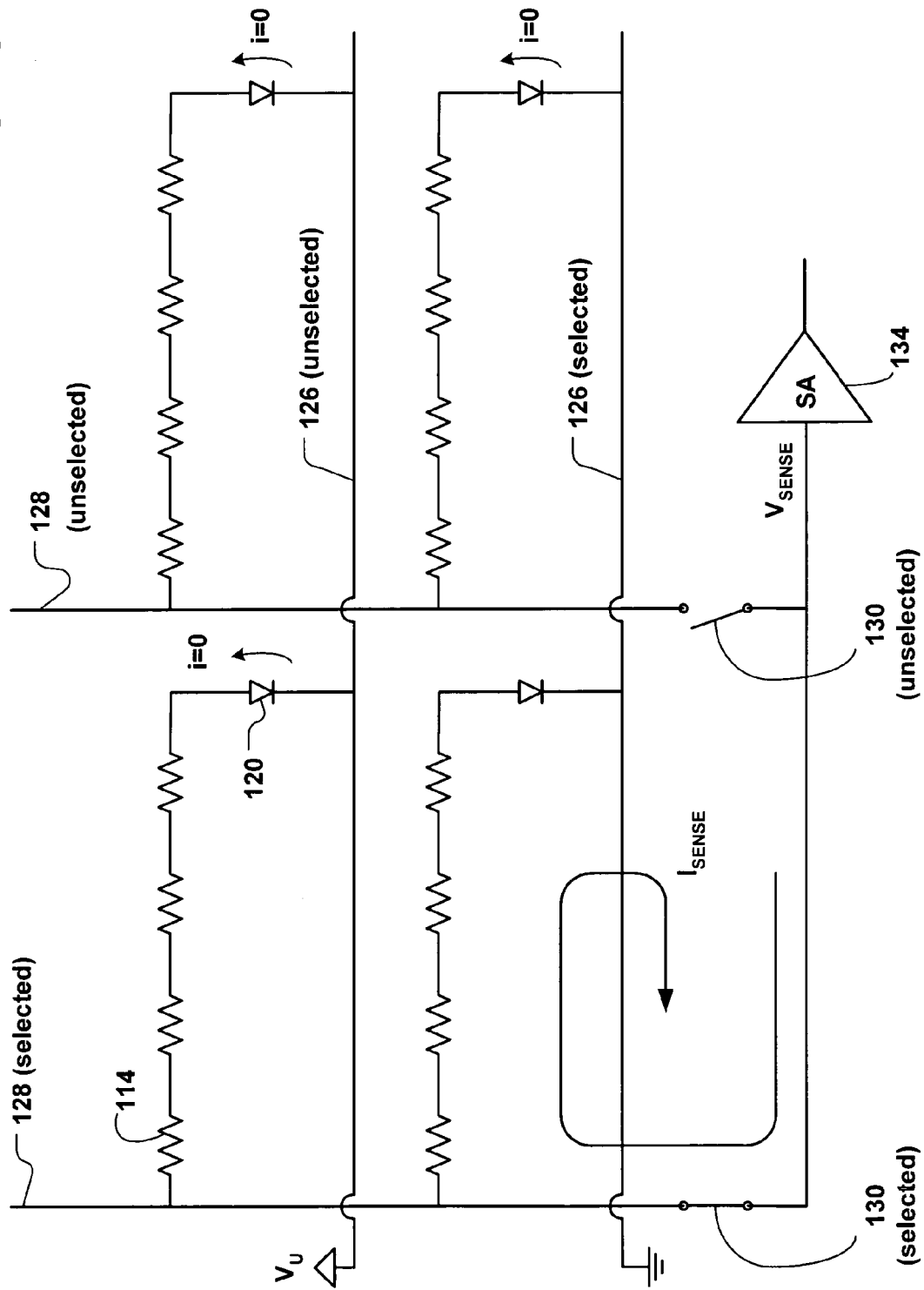
FIG. 5 is an illustration of currents flowing through the device during a sense operation.

As illustrated in FIG. 5, the sense amplifier 134 applies a potential ($V_{SENSE}$) to the selected read bit line 128, and a selected read word line 126 is set to a reference potential. In addition, all of the unselected read lines are set to a potential $V_U$, where $V_U$ is greater than or equal to $V_{SENSE}$ to reverse-bias the diodes 120 connected to the unselected read word lines 126 As a result, the sense current ($I_{SENSE}$) flows only through the selected group of memory elements cells and series diode, while currents in the unselected groups are blocked (i=0). Because sneak path currents do not interfere with the sense current, reliability of the sensing is increased. However, memory cell density is not reduced, since a single diode 120 is common to a plurality of memory elements 114.

Returning to FIG. 4, the sense amplifier 134 samples the sense current and stores the sampled value (step 412). The sense current is proportional to the series resistance of the four memory elements 114 and the diode 120.

The read/write circuit then performs a write operation to the selected memory element 114. This write operation sets the selected memory element 114 to a known resistance state (step 414). The write operation may be performed as illustrated in FIG. 3.

Once again, a sense current is caused to flow through the group including the selected memory element 114. And once again, the sneak path currents are blocked by the blocked by diodes 120 connected to unselected read word lines 126.

The sense amplifier 134 samples the sense current and compares the second sampled value to the stored value (step 418). The comparison indicates the logic value that was originally stored in the selected memory cell. If the second sampled value and the stored value are about same, the original logic value is the same as the logic value written to the selected memory cell at step 414. If the second sampled value and the stored value differ by an amount that indicates a change in resistance states of the selected memory element 114, the original logic value is the complement of the logic value written to the selected memory element 114 at step 414.

An output of the sense amplifier 134 is provided to the I/O register 136. Thus the I/O register stores the value that was read out.

The read operation is destructive in that the original logic value of the selected memory element 114 is overwritten. If changed, the original value is restored via another write operation (step 420).

Thus only one memory element in the selected group potentially changes resistance states during the destructive read operation. The unselected cells in the selected group do not change resistance states and are treated as common mode resistances during the multiple samples of the read operation.

The destructive read operation has the advantage of being self-referencing. That is, an external reference is not needed to determine whether the resistance state of a selected memory element 114 is $R_{parallel}$ or $R_{anti-parallel}$. Because the destructive read operation is self-referencing, it is more reliable and less complex than simply sensing the resistance state of a selected memory cell and comparing the sensed state to a reference signal. Generating reference signals for a large cross point resistive array can be complicated. There can be significant variations in memory cell resistances across the array. Consequently, a reference signal that is used by one group of memory cell might not be usable by another group of memory cells.

Another advantage of the present invention is short-tolerance. If one memory element 114 is shorted (due to a manufacturing defect, for instance), the shorted element 114 in the group will be unusable, but the other memory elements 114 in the group will still be usable. Voltage drops across the blocking element 120 and the usable memory elements 114 will be greater, and the sense currents will be larger. However, the read operation will not be affected by either, since the read/write circuit looks for a change in sense current, not an absolute value of sense current.

The read sense voltage applied to each data storage group during steps 410 and 416 is determined in part by the number of memory elements 114 in the groups. The voltage drop across each memory element 114 may be optimum. The optimum read sense voltage refers to the voltage applied across the memory element 114 to yield the greatest signal out of the sense amplifier 134 (resistance ratio of the memory element 114 decreases as applied voltage increases, and signal current increase as the applied voltage increases). Yet this offers another advantage, since increasing the number of memory elements 114 in a group increases the voltage that can be applied to the group while maintaining the optimum read sense voltage. If a group contains a sufficient number of memory elements 114, $V_{DD}$ can be applied to the group during steps 410 and 416. As an added benefit, an additional source for generating a low voltage is not needed for steps 410 and 416.

Figure 6:
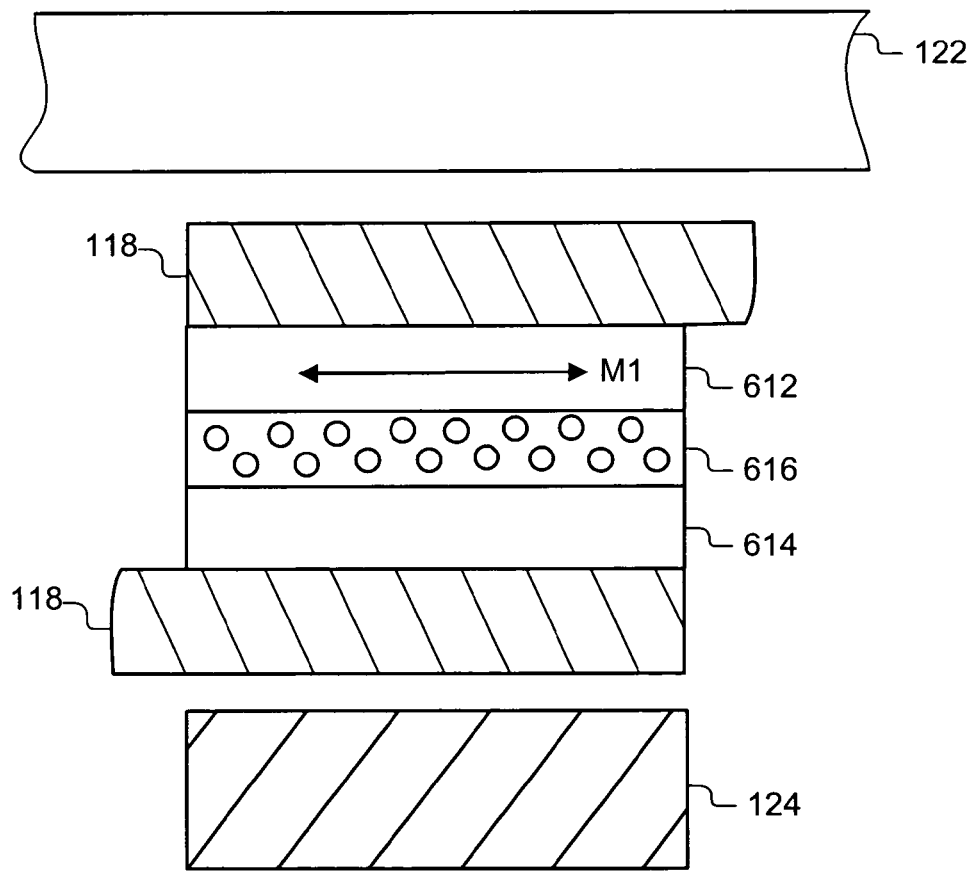
FIG. 6 is an illustration of a tunneling magnetoresistive element.

Reference is made to FIG. 6, which illustrates an exemplary magnetoresistive element 114: a spin dependent tunneling ("SDT") junction. The SDT junction includes ferromagnetic free and reference layers 612 and 614 separated by an insulating tunnel barrier 616. An upper portion of a read interconnect line 118 is in contact with one of the ferromagnetic layers 612 or 614, and a lower portion of the read interconnect line 118 is in contact with the other of the two ferromagnetic layers 612 or 614. The reference layer 614 can be either above or below the free layer 612. By way of example, FIG. 6 shows the reference layer 614 below the free layer 612.

The free layer 612 has a magnetization vector (M1) that can be oriented in either of two directions in the plane of the free layer 612 when exposed to the magnetic fields about the selected write word and bit lines 122 and 124. The reference layer 614 has a magnetization vector that lies in the plane of the reference layer 614.

The insulating tunnel barrier 616 allows quantum mechanical tunneling to occur between the free and reference layers 612 and 614. This tunneling phenomenon is electron spin dependent, making the resistance of the SDT junction a function of its magnetization orientation. Resistance of the SDT junction is a first value ($R_{parallel}$) if the magnetization vectors of the free and reference layers 612 and 614 point in the same direction (that is, if the SDT junction has a parallel magnetization orientation), and the resistance is a second value ($R_{anti-parallel}$) if the magnetization vectors point in opposite directions (that is, if the SDT junction has an anti-parallel magnetization orientation).

The reference layer 614 can be either pinned or soft. In a pinned reference layer, the magnetization is fixed (for example, by an AF pinning layer) so as not to rotate when exposed to the magnetic fields about the word lines 122 and 124. A soft reference layer has a coercivity that is much lower than coercivity of the free layer 612. The magnetization vector of the soft reference layer can be oriented in either of two directions in the plane of the reference layer when exposed to the magnetic fields about the word lines 122 and 124. During read operations, either write line 122 or 124 can be used to create an external magnetic field that orients the magnetization vector of the soft reference layer. A magnetoresistive element having a soft reference layer is described in greater detail in assignee's U.S. Pat. No. 6,576,969 ("Magneto-resistive device having soft reference layer").

The present invention is not limited to diodes for blocking sneak path currents. Other types of blocking elements may be used. For instance, transistors may be used instead of the diodes. Moreover, the blocking elements may be formed in the substrate instead of on the substrate.

Figure 7:
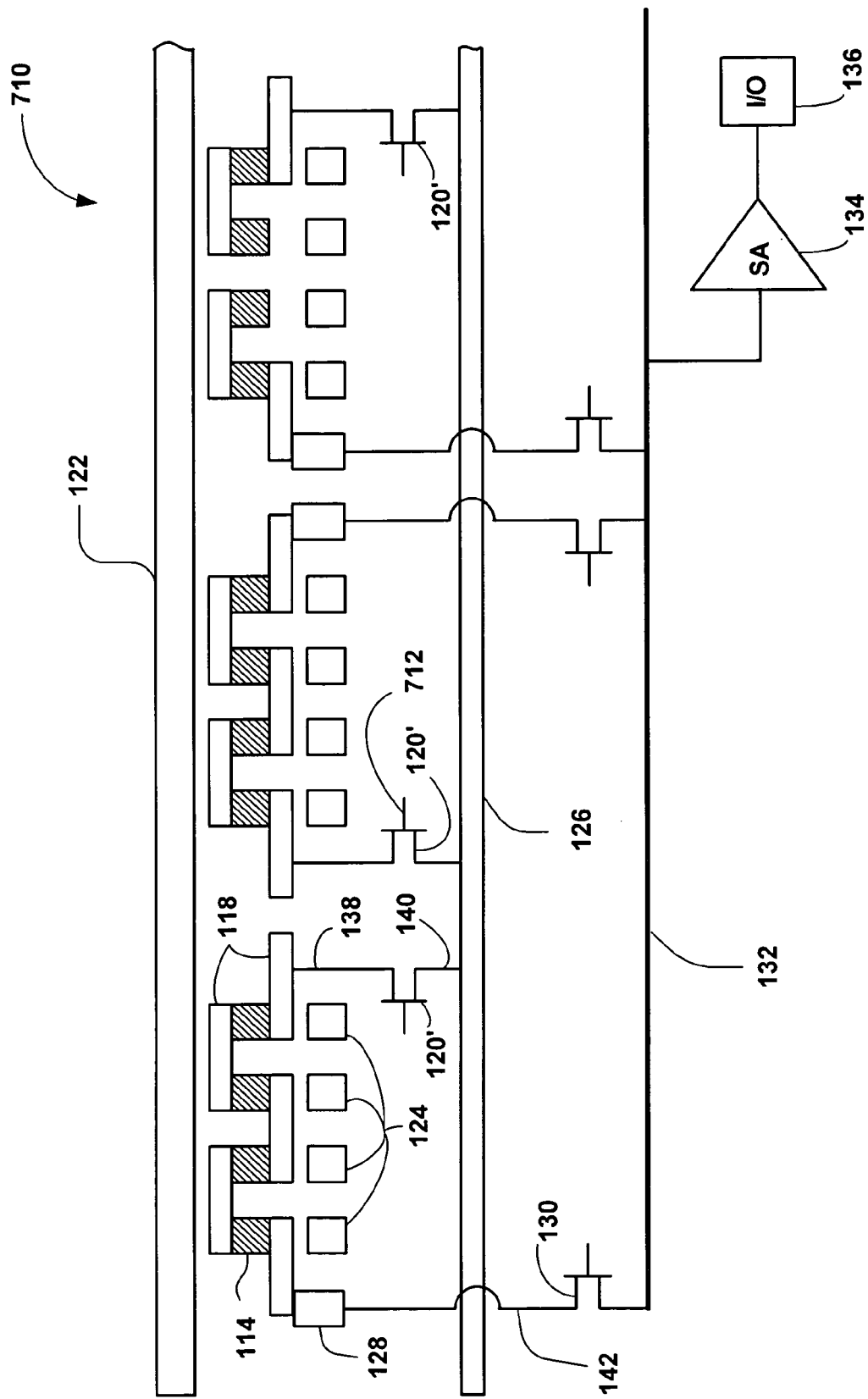
FIG. 7 is an illustration of a row of a data storage device according to an embodiment of the present invention.

Reference is made to FIG. 7, which shows an MRAM device 710 having essentially the same as the configuration shown in FIG. 2, except that the blocking devices are transistors 120' instead of diodes, and that control lines 712 are provided for switching the transistors 120' on and off. The transistors 120' in selected groups are turned on to allow a sense currents to flow through the selected groups, and the transistors 120' in the unselected groups are turned off to prevent sneak path currents from through the unselected groups.

Although read and write operations were described above as being performed on a single selected memory element at a time, the present invention is not so limited. Read and write operations can be performed on multiple selected memory elements simultaneously.

The number of memory elements 114 per group is not limited to four. The number of series memory elements in a group can be determined by signal-to-noise (SNR) of the sense amplifier 134. The larger the number of memory elements 114 in a group the smaller will be the signal out of the sense amplifier 134. The number of memory elements 114 in a group can also be limited by the voltage applied to the read bit lines 126. A larger read voltage will allow more memory elements 114 to be added to the group. The limit on the maximum bit line read voltage will be governed by the voltage limits of the process technology. For example, for a 0.1 um or 0.25 um CMOS technology with a $V_{DD}$ limit of 2 to 3.3V, a forward diode voltage of 0.7V and a tunnel junction sense voltage of 400 mv, the optimum number in a group will vary between two and eight.

The groups are not limited to one blocking device. Multiple blocking devices could be used per group.

The present invention is not limited to random access memory, nor is it limited to TMR devices. The memory elements could be giant magnetoresistive (GMR) devices instead.

The memory elements are not even limited to magnetoresistive elements. For example, a memory device according to the present invention could include, without limitation, a cross point array of resistive memory elements such as phase change elements, programmable metallization cell memories, or anti-fuse write-once memories.

The present invention is not limited to the specific embodiments described and illustrated above. Instead, the present invention is construed according to the claims that follow.

What is claimed is:

1. A data storage device comprising a cross point array of resistive memory elements and a plurality of blocking elements, the memory elements and the blocking elements arranged in groups, each group including series-connected memory elements and a blocking element, the memory elements of each group lying in the same plane.

2. The device of claim 1, wherein the memory elements include magnetoresistive elements.

3. The device of claim 1, wherein the memory elements include tunneling magnetoresistive elements.

4. The device of claim 1, wherein the blocking elements include diodes.

5. The device of claim 1, wherein the blocking elements include transistors.

6. The device of claim 1, further comprising a substrate, the blocking elements formed on the substrate.

7. A data storage device comprising a cross point array of resistive memory elements and a plurality of blocking elements, the memory elements and the blocking elements arranged in groups, each group including memory elements, a blocking element, and a discontinuous conductor for connecting the memory elements and the blocking element in series.

8. The device of claim 7, further comprising a plurality of first and second read lines, the first read lines being orthogonal to the second read lines, each group connected between one of the first read lines and one of the second read lines.

9. The device of claim 8, further comprising a circuit for applying a first potential to a selected first read line, and a second potential to a selected second read line during a read operation on a selected memory element, a difference between the first and second potentials causing a sense current to flow through a group including the selected memory element.

10. The device of claim 9, wherein the circuit also applies a third potential to unselected first read lines during read operations, the third potential equal to or greater than the first and second potentials, whereby sneak path currents are blocked.

11. The device of claim 9, wherein one of the first and second potentials is $V_{DD}$.

12. The device of claim 8, further comprising a plurality of first and second write lines, the first write lines orthogonal to the second write lines, each memory element at the cross point of a first write line and a second write line.

13. The device of claim 1, further comprising a circuit for performing destructive read operations on the memory elements.

14. A data storage device comprising:
a cross point array of resistive memory elements and a plurality of blocking elements, the memory elements and the blocking elements arranged in groups, each group including series-connected memory elements and a blocking element; and
a circuit for determining a logic value stored in a selected memory element of a selected group, the circuit causing a sense current to flow through the selected group, sampling the sense current and storing the sampled value, writing a logic value to the selected memory element in the selected group, causing a sense current to flow through the selected group, and sampling the sense current and comparing the second sampled value to the stored value.

15. An MRAM device comprising:
a cross point array of tunneling magnetoresistive memory elements; and
a plurality of sneak path blocking elements;
the device arranged in groups, each group including at least two memory elements and at least one blocking device connected in series, the series-connected elements of each group located at different cross points in the array.

16. The device of claim 15, wherein the blocking elements include diodes.

17. The device of claim 15, wherein the blocking elements include transistors.

18. The device of claim 15, further comprising a substrate, the array and the blocking elements formed on the substrate.

19. An MRAM device comprising:
a cross point array of tunneling magnetoresistive memory elements;
a plurality of sneak path blocking elements; and
a plurality of discontinuous conductors;
the device arranged in groups, each group including at least two memory elements, at least one blocking device, and a discontinuous conductor for connecting the memory elements and the blocking element in series.

20. The device of claim 15, further comprising a plurality of first and second read lines, the first read lines being orthogonal to the second read lines, each group connected between one of the first read lines and one of the second read lines.

21. An MRAM device comprising:
a cross point array of tunneling magnetoresistive memory elements;
a plurality of sneak path blocking elements, the device arranged in groups, each group including at least two memory elements and at least one blocking device connected in series; and
a circuit for applying a first potential to a selected first read line, and a second potential to a selected second read line during a read operation on a selected memory element, a difference between the first and second potentials causing a sense current to flow through a group including the selected memory element.

22. The device of claim 21, wherein the circuit also applies a third potential to unselected first read lines during read operations, the third potential equal to or greater than the first and second potentials, whereby sneak path currents are blocked.

23. The device of claim 21, wherein one of the first and second potentials is $V_{DD}$.

24. The device of claim 15, further comprising a plurality of first and second write lines, the first write lines orthogonal to the second write lines, each memory element at the cross point of a write word line and a write bit line.

25. The device of claim 15, further comprising a circuit for performing destructive read operations on the memory elements.

26. The device of claim 15, further comprising a circuit for determining a logic value stored in a selected memory element of a selected group, the circuit causing a sense current to flow through the selected group, sampling the sense current and storing the sampled value, writing a logic value to the selected memory element in the selected group, causing a sense current to flow through the selected group, and sampling the sense current and comparing the second sampled value to the stored value.

* * * * *